US008055376B2

United States Patent
Doki et al.

(10) Patent No.: US 8,055,376 B2
(45) Date of Patent: Nov. 8, 2011

(54) SUBSTRATE PROCESSING SYSTEM, SUBSTRATE PLACING POSITION ADJUSTING METHOD AND STORAGE MEDIUM

(75) Inventors: Yuichi Doki, Koshi (JP); Tokutarou Hayashi, Koshi (JP)

(73) Assignee: Tokyo Electron Limited, Tokyo-to (JP)

( * ) Notice: Subject to any disclaimer, the term of this patent is extended or adjusted under 35 U.S.C. 154(b) by 961 days.

(21) Appl. No.: 11/924,911

(22) Filed: Oct. 26, 2007

(65) Prior Publication Data

US 2008/0102200 A1 May 1, 2008

(30) Foreign Application Priority Data

Oct. 27, 2006 (JP) ................................. 2006-292481

(51) Int. Cl.
*G06F 7/00* (2006.01)
(52) U.S. Cl. ........................................ 700/214; 414/936
(58) Field of Classification Search .................. 700/214, 700/218; 414/936, 935, 941; 901/46, 47
See application file for complete search history.

(56) References Cited

U.S. PATENT DOCUMENTS

| 6,516,244 | B1 * | 2/2003 | Yoo et al. ....................... 700/218 |
| 6,915,183 | B2 * | 7/2005 | Iida et al. ....................... 700/218 |
| 6,973,370 | B2 | 12/2005 | Ito et al. |
| 2005/0207800 | A1 * | 9/2005 | Yamaguchi et al. .......... 399/302 |
| 2009/0253130 | A1 * | 10/2009 | Yoo ................................... 435/6 |

FOREIGN PATENT DOCUMENTS

JP   2005-19963   1/2005

* cited by examiner

*Primary Examiner* — Ramya Prakasam
(74) *Attorney, Agent, or Firm* — Oblon, Spivak, McClelland, Maier & Neustadt, L.L.P.

(57) ABSTRACT

In a substrate processing system for processing a substrate, such as a wafer W, held by a substrate holding device rotatable about a vertical axis, such as a spin chuck, a jig is placed on the substrate holding device, and centrifugal acceleration imparted to a predetermined measuring position on the jig and an eccentricity of the measuring position from the rotation center of the spin chuck are determined. The position of the rotation center is determined on the basis of centrifugal accelerations imparted to the measuring position when the jig is placed at three different positions and eccentricities of the measuring position from the rotation center when the jig is placed at the three different positions. Data on a substrate placing position, the center of the substrate placed at which coincides with the rotation center, is stored as data of a substrate placing position at which a substrate is to be placed.

20 Claims, 14 Drawing Sheets

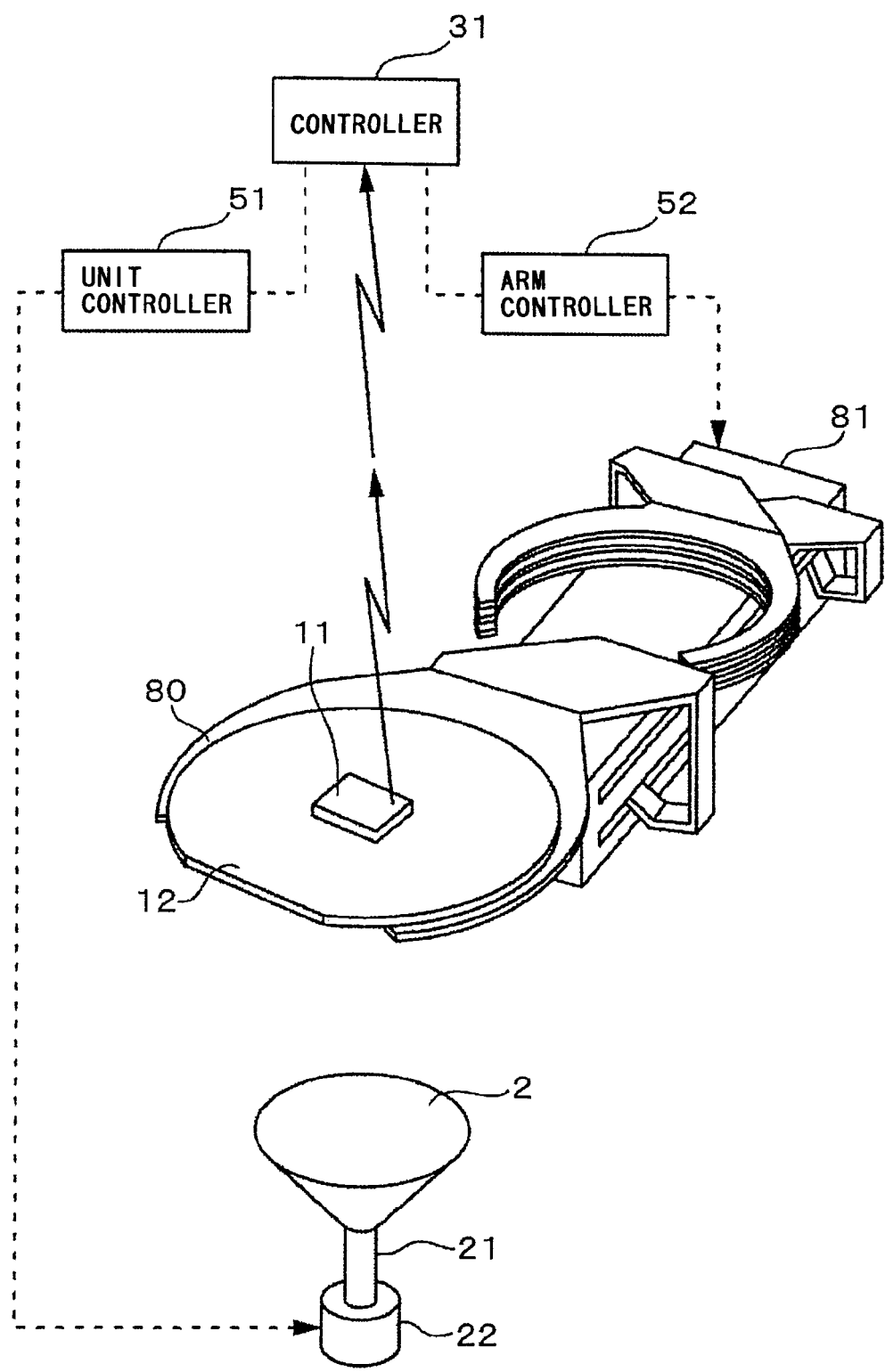
F I G. 5

SUBSTRATE PROCESSING SYSTEM, SUBSTRATE PLACING POSITION ADJUSTING METHOD AND STORAGE MEDIUM

BACKGROUND OF THE INVENTION

1. Field of the Invention

The present invention relates to a technique for transferring a substrate to and accurately positioning the same at a predetermined position on a substrate holding device included in a processing unit for processing a substrate held on a substrate holding device by a coating process for coating the substrate with, for example, a resist solution and a developing process.

2. Description of the Related Art

A photoresist process, which is one of semiconductor device fabricating processes, includes the steps of forming a thin resist film on a surface of, for example, a semiconductor wafer (hereinafter, referred to simply as "wafer"), exposing the resist film to light through a mask of a predetermined pattern, and developing the exposed resist film to obtain a predetermined mask pattern. Generally, these steps of the photoresist process are carried out by a processing system built by combining a coating and developing system and an exposure system.

To achieve high throughput and to minimize footprint, the substrate processing system includes a necessary number of processing units respectively including processing devices respectively for processing a substrate by different processes, such as a coating process, a developing process and a heating and cooling process, and stacked in layers, and substrate carrying means for carrying a substrate to those processing units.

Generally, a wet processing unit for carrying out coating and developing processes, among those processing units, carries out a spin-coating process by holding a wafer substantially horizontally by a spin chuck, namely, a substrate holding device, pouring a process solution, such as a resist solution or a developer, onto a substantially central part of the wafer, and rotating the spin chuck.

The wafer is required to be transferred to the spin chuck and to be accurately positioned at a predetermined position on the spin chuck to process the wafer accurately by the wet processing unit. For example, a coating unit that uses a resist solution, namely, a process solution, spreads the resist solution on a surface of a wafer by spin-coating, and executes an edge rinsing process to remove an edge part of a resist film by pouring a cleaning solution onto a peripheral part of the rotating wafer. If the wafer is eccentric with respect to the rotation axis of the spin chuck during the edge rinsing process, the resist film is not removed from some areas of the a peripheral part of the wafer and the wafer is removed excessively from some other areas of the peripheral part. Consequently, a defective resist film is formed on the wafer.

A teaching procedure is executed before starting the substrate processing system to teach a position on the spin chuck at which a wafer is to be placed to the substrate carrying means of the substrate processing system. A teaching procedure disclosed in JP-A 2005-19963 (Paragraphs 0035 to 0037, FIGS. 8 and 9) places a wafer marked with a printed, small circular mark on a spin chuck, images of the circular mark are obtained by CCD camera disposed above the wafer while the spin chuck is intermittently turn at angular intervals of 90°, determines the rotation center of the spin chuck on the basis of displacements of the circular mark, and teaches the carrying means placing a wafer on the spin chuck with the center of the wafer coincided with the rotation center of the spin chuck.

SUMMARY OF THE INVENTION

The image of the circular mark printed on a wafer is obtained by the CCD camera. Therefore, in some case, the rotation center of the spin chuck cannot be accurately determined when the CCD camera is an inexpensive one capable of forming an image in low resolution. Accurate teaching needs an expensive CCD camera, which increases the manufacturing cost of the system. Image processing load increases, a long image processing time is needed and expensive computer is needed to process high-resolution image data for accurate teaching. The CCD camera needs to be disposed at a height from the spin chuck such that the circular mark is contained in the angle of view, which is an obstruct to the miniaturization of the wet processing unit in some cases.

The present invention has been made in view of such problems and it is therefore an object of the present invention to provide a compact substrate processing system capable of transferring a substrate to and accurately positioning the same at a predetermined position, a substrate placing position adjusting method, and a storage medium storing a program specifying the substrate placing position adjusting method.

A substrate processing system according to the present invention having a processing unit for processing a substrate held substantially horizontally by a substrate holding device rotatable about a vertical axis, and capable of acquiring data on a wafer placing position on the substrate holding device, at which a substrate carrying means is required to place the substrate beforehand, includes: a jig to be transferred to the substrate holding device by the substrate carrying means: a measuring means for measuring centrifugal acceleration imparted to a measuring position on the jig when the substrate holding device holding the jig is rotated at a fixed angular velocity; an arithmetic means for calculating an eccentricity of the measuring position from a rotation center of the substrate holding device on the basis of a centrifugal acceleration measured by the measuring means; a position determining means for determining the position of the rotation center of the substrate holding means on the basis of eccentricities of two substrate placing positions determined by changing the position of the jig on the substrate holding device, and a centrifugal acceleration imparted to or an eccentricity of a substrate placing position other than the two substrate placing positions; and a storage means for storing data on a position of a substrate where a center of the substrate coincides with the rotation center of the substrate holding device as data on a substrate placing position.

In the substrate processing system, the position determining means may draw three circles having radii corresponding to eccentricities of the measuring position of the jig placed at three different placing positions on the substrate holding means from the rotation center of the substrate holding means, and centers at the three different substrate placing positions, respectively, and may determine an intersection point of the three circles as the rotation center of the substrate holding means. The position determining means may place the jig at two different placing positions on the substrate holding means, may draw two circles having radii corresponding to eccentricities of the measuring position of the jig placed at the two different placing positions from the rotation center of the substrate holding means, and centers at the two different substrate placing positions, respectively, may place the jig again such that the measuring position thereof coincides with one of two intersections of the two circles, may determine the measuring position of the jig to be the rotation center of the substrate holding device if centrifugal acceleration imparted to the measuring position is zero or lower than a predetermined value or may determine the other intersection point of the two circles to be the rotation center if the measured acceleration is not zero or above the predetermined value. Preferably, the substrate processing system further includes an instructing means for giving an instruction indicating a jig placing position to the substrate carrying means.

Preferably, the arithmetic means is connected to the measuring means on the jig. The measuring means or the arithmetic means may send data on the centrifugal acceleration or the eccentricities to the position determining means by radio. Preferably, the jig has a shape identical with that of a substrate to be processed by the substrate processing system. Preferably, the measuring means is attached to the jig such that the measuring position coincides with the center of the jig. It is preferable that the measuring means is a piezoelectric acceleration sensor.

Preferably, the substrate processing system further includes a substrate transfer means, the substrate transfer means being a vertically movable support members capable of receiving a substrate at a position above the substrate holding device and of lowering to place the substrate on the substrate holding device or the substrate holding device; wherein the substrate carrying means is capable of transferring a substrate to and receiving a substrate from the substrate transfer means by moving up or down at a fixed speed and of intersecting the substrate transfer means without interfering with the substrate transfer means, the measuring means being capable of measuring acceleration imparted to the jig when the jig moves vertically, and a second position determining means determines a substrate placing position with respect to a vertical direction between the substrate carrying means and the substrate transfer means on the basis of the position of the substrate carrying means at a time point when acceleration acting in a direction opposite the moving direction of the substrate carrying means is measured.

A substrate placing position adjusting method according to the present invention, which acquires data on a substrate placing position where the substrate carrying means is required to place a substrate on a substrate holding device capable of rotating about a vertical axis and included in a processing unit for processing a substrate substantially horizontally held by the substrate holding device includes the steps of: transferring a jig from the substrate carrying means to the substrate holding device; measuring centrifugal acceleration imparted to a measuring position in the jig when the substrate holding device holding the jig is rotated at a fixed angular velocity; calculating an eccentricity of the measuring position from a rotation center of the substrate holding device on the basis of a centrifugal acceleration measured by the measuring means; changing the position of the jig on the substrate holding device to determine a position of the rotation center of the substrate holding device on the basis of eccentricities of two different jig placing positions, centrifugal acceleration imparted to a jig placing position other than the two jig placing positions, and the eccentricity of the jig placing position other than the two jig placing positions; and storing data on a position, the center of a substrate placed at which coincides with the rotation center of the substrate holding device, as data on a substrate placing position.

The step of determining the position of the rotation center of the substrate holding device may place the jig at each of three different positions with its measuring position coincided with each of the three positions, may determine eccentricities of the three positions, may draw three circles having radii equal to the eccentricities, respectively, and may determines an intersecting point of those three circles as a substrate placing position. The step of determining the position of the rotation center of the substrate holding device may place the jig on the substrate holding device at each of two different positions with its measuring position coincided with each of the two different positions, may determine eccentricities of the two positions, may draw two circles having radii equal to the eccentricities, respectively, and centers respectively at the two positions, may place the jig at one of two intersection points of the two circles, and may determine that the position of the intersection point is the rotation center of the substrate holding device if a measured centrifugal acceleration imparted to the measuring position of the jig placed at the intersection point is zero or not higher than a predetermined value or that the other intersection point is the rotation center of the substrate holding device if the measured centrifugal acceleration is not zero or above the predetermined value.

Preferably, the substrate placing position adjusting method further includes the step of giving information about a jig placing position to the carrying means when the step of determining the rotation center of the substrate holding device specifies the position of the rotation center of the substrate holding device.

Preferably, the step of measuring centrifugal acceleration uses a piezoelectric acceleration sensor attaché to the jig for measuring centrifugal acceleration. Preferably, the jig has a shape identical with that of a substrate to be processed by a substrate processing system. Preferably, the acceleration sensor is attached to the jig with the measuring position coincided with the center of the jig.

Preferably, the substrate placing position adjusting method further includes the steps of: transferring a substrate between the substrate carrying means and vertically movable support members capable of receiving a substrate at a position above the substrate holding device and of lowering to place the substrate on the substrate holding device or the substrate holding device serving as a substrate transfer means by moving the substrate carrying means up or down at a fixed speed and making the substrate carrying means intersect the substrate transfer means without interfering with the substrate transfer means; measuring acceleration imparted to the jig when the jig is moved vertically; and determining a substrate transfer position with respect to a vertical direction between the substrate carrying means and the substrate transfer means on the basis of the position of the substrate carrying means at a time point when acceleration acting in a direction opposite a moving direction of the substrate carrying means is measured.

A storage medium according to the present invention for storing a program to be executed by a substrate processing system including a processing unit for processing a substrate held substantially horizontally by a substrate holding device rotatable about a vertical axis, and capable of acquiring data on a substrate placing position at which a substrate carrying means is required to place a substrate on the substrate holding device beforehand; wherein the program has a set of instructions for carrying out the steps of the foregoing substrate placing position adjusting method.

According to the present invention, the jig placed on the substrate holding device is rotated, and the rotation center of the substrate holding device is determined on the basis of centrifugal acceleration imparted to the measuring position and the eccentricity of the measuring position from the rotation center. Therefore, an inexpensive, accurate teaching procedure, as compared with a teaching procedure for determining the rotation center by using a CCD camera, can be achieved. The substrate placing position adjusting method of the present invention does not need any image processing operation. Therefore, load on the computer is low, and those operations can be carried out in a comparatively short time by a comparatively inexpensive computer. Since a small measuring device, such as a piezoelectric acceleration sensor, is attached to the jig, any space for a CCD camera does not need to be secured in the substrate processing system, which contributes to miniaturizing the substrate processing system.

BRIEF DESCRIPTION OF THE DRAWINGS

FIG. 5 is a schematic perspective view of a teaching system for carrying out a teaching procedure for teaching a substrate placing position;

DESCRIPTION OF THE PREFERRED EMBODIMENTS

Figure 1:
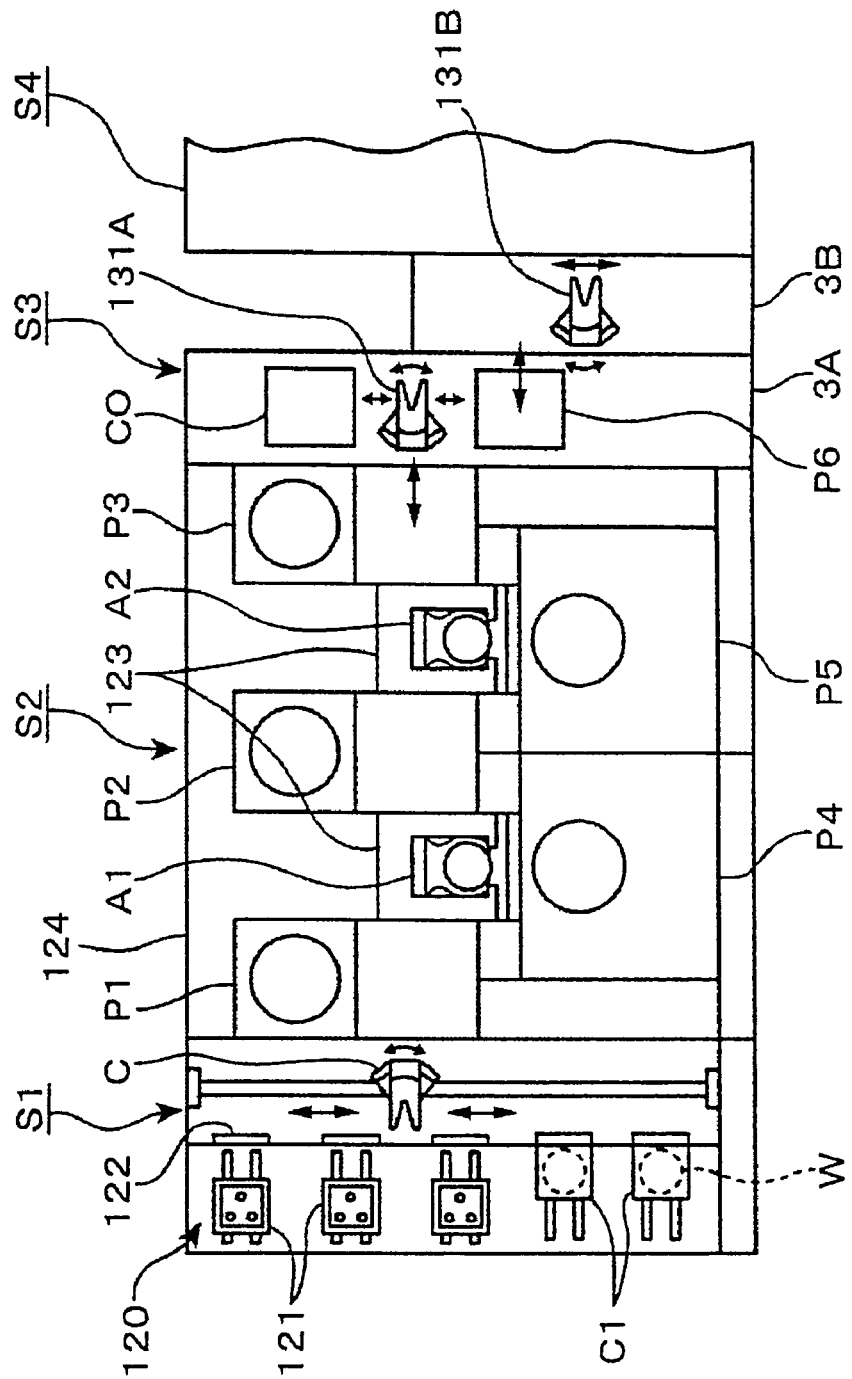
FIG. 1 is a plan view of a coating and developing system in a first embodiment according to the present invention.
Figure 2:
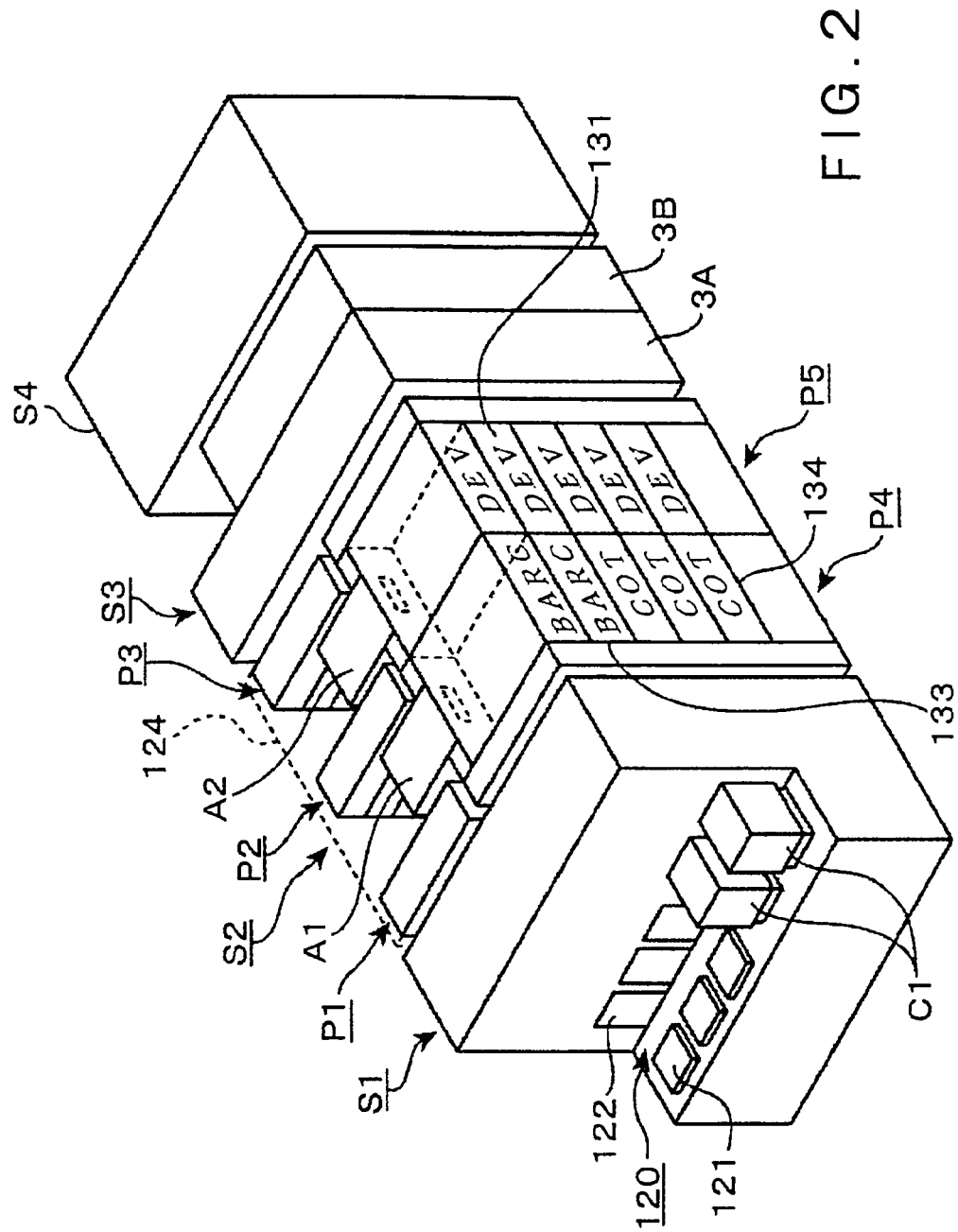
FIG. 2 is a perspective view of the coating and developing system shown in FIG. 1.

A coating and developing system including a wet processing unit will be described as an example of a substrate processing system in a first embodiment according to the present invention with reference to FIGS. 1 and 2. In FIGS. 1 and 2, indicated at S1 is a carrier block including a carrier station 120 provided with carrier tables 21 on which closed carriers C1 each containing, for example, thirteen wafers W, and a transfer arm C that takes out the wafers W from the carrier C1 through an opening 122 closed by a door and formed in a wall on the rear side of the carrier station 120.

A processing block S2 enclosed in a box 124 is connected to the rear end of the carrier block S1. In the processing block S2, shelf units) 1, P2 and P4 each including heating and cooling units stacked in layers are arranged longitudinally in that order, wet processing units PR and P5 are arranged longitudinally in that order, and main arms A1 and A2, namely, substrate carrying means, are disposed between the shelf units P1 and P2 and between the shelf units P2 and P3, respectively. The main arms A1 and A2 transfer wafers W from one to another of those units. The main arm A1 is installed in a space 123 defined by the opposite side walls of the adjacent shelf units P1 and P2, a left side wall, as viewed from the carrier block S1, of the wet processing unit P4, and a back wall on the left side as viewed from the carrier block S1. The main arm A2 is installed in a space 123 defined by the opposite side walls of the adjacent shelf units P2 and P3, a left side wall, as viewed from the carrier block S1, of the wet processing unit P5, and a back wall on the left side as viewed from the carrier block S1.

Each of the shelf units P1, P2 and P3 is built by stacking different kinds of units in plural layers. Those units carries out pretreatment processes and posttreatment processes before and after, respectively, processes to be carried out by the wet processing units P4 and P5. Those units include plural baking units (PAB) for baking a wafer W and cooling units for cooling a wafer W.

As shown in FIG. 2, the wet processing unit P4 is built by stacking, bottom antireflection film forming units (BARC) 133 and resist solution application units (COT) 134 in, for example, five layers on a chemical solution storage unit. The wet processing unit P4 is built by stacking developing units (DEV) 131 in, for example five layers on the chemical solution storage unit. The developing units (DEV) 131 carry out a developing process that pours a developer onto a wafer W. The chemical solution storage unit stores chemical solutions including a resist solution and a developer.

An interface block S3 is interposed between the processing block S2 and an exposure system S4. The interface unit S3 has a first carrying chamber 3A and a second carrying chamber 3B longitudinally arranged in that order. The first carrying chamber 3A and the second carrying chamber 3B are provided with wafer carrying mechanisms 131A and 131B, respectively. The wafer carrying mechanisms 131A and 131B are vertically movable, turnable about a vertical axis and horizontally movable.

A shelf unit P6 and a buffer cassette CO are installed in the first carrying chamber 3A. The shelf unit P6 is built by stacking a transfer stage (TRS) through which a wafer W is transferred between the wafer carrying mechanisms 131a and 131B, a heating unit (PEB) for heating a wafer W processed by an exposure process, and a precision temperature control unit provided with a cooling plate in layers.

The flow of a wafer W in the coating and developing system will be described. A carrier C1 containing wafers W is delivered from an external device to the carrier block S1. Then, a wafer W taken out of the carrier C1 is transferred to the transfer arm C, the transfer unit (TRS) of the shelf unit P1, the main arm A1, the bottom antireflection film forming unit (BARC) 133, the main arm A1, the heating unit, the main arm A1, the cooling unit, a hydrophobicity imparting unit, the main arm A1, the cooling unit, the main arm A1, the resist solution application unit (COT) 134, the main arm A1, the heating unit, the main arm A1, the cooling unit, the main arm A2, the transfer stage (TRS) of the shelf unit P3, the wafer carrying mechanism 131A, the transfer stage (TRS) of the shelf unit P6, the wafer carrying mechanism 131B and the exposure system S4 in that order.

The wafer W processed by an exposure process is transferred to the wafer carrying mechanism 131B, the transfer stage (TRS) of the shelf unit P6→the wafer carrying mechanism 131A→the heating unit of the shelf unit P6→the wafer carrying mechanism 131A→the temperature adjusting unit of the shelf unit P6→the wafer carrying mechanism 131A→the transfer stage (TRS) of the shelf unit P3→the main arm A2→the cooling unit→the developing unit 131→the main arm A2→the heating unit→the main arm A1→the transfer stage (TRS) of the shelf unit P1→the transfer arm C in that order. Then, the processed wafer W is returned to the carrier C1 to complete a coating and developing process.

The construction of the main arms A1 and A2, i.e., the carrying means for carrying a wafer W to the resist application unit 134 and the developing unit 131, will be described with reference to FIG. 3. The main arm A1 (the main arm A2) has, for example, four carrying arms 80 for supporting a wafer W in a horizontal position, and a moving base 81 supporting the carrying arms 80 to move the carrying arms 80. Each of the carrying arms 80 is formed in a shape resembling a horseshoe so that, for example, a peripheral part of the lower surface of a wafer W can be seated thereon. Each of the carrying arms 80 has a base end part interlocked with a drive mechanism, not shown, formed in the moving base 81. The carrying arms 80 can be advanced in a directions R indicated in FIG. 3 and can be retracted. The moving base 81 moves the four carrying arms 80 in directions Z and turns the four carrying arms 80 in a direction θ indicated in FIG. 3.

The position of each carrying arm 80 of the main arm A1 (the main arm A2) in a horizontal plane is determined by moving the carrying arm 80 in the direction R and turning the same in the direction θ and is represented by polar coordinates. The position of each carrying arm 80 of the main arm A1 (the main arm A2) with respect to a vertical direction is determined by moving the main arm A1 (the main arm A2) in the direction Z. That is, the position of each carrying arm 80 is represented by coordinates (R, θ, Z). Moving distance of the carrying arm 80 is controlled by controlling the operation of the drive mechanism interlocked with the shaft of the carrying arm 80 using, for example, an encoder. The main arm A1 (the main arm A2) is installed in a space surrounded by walls 82. Each of the walls is provided with vertically arranged openings 83. A wafer W can be carried into and carried out of the processing unit through the opening 83 corresponding to the processing unit.

The coating and developing system is capable of carrying a teaching procedure for teaching wafer placing positions at which a wafer W is to be placed on substrate holding devices installed in the wet processing units P4 and P5 to the main arms A1 and A2. The same teaching procedure is executed to teach the wafer placing positions to the bottom antireflection film forming unit 133, the resist solution application unit 134 and the developing unit 131. Therefore, the teaching procedure will be described as applied to teaching a wafer placing position to the resist solution application unit 134 (hereinafter, referred to as "coating unit 134") by way of example.

Figure 4:
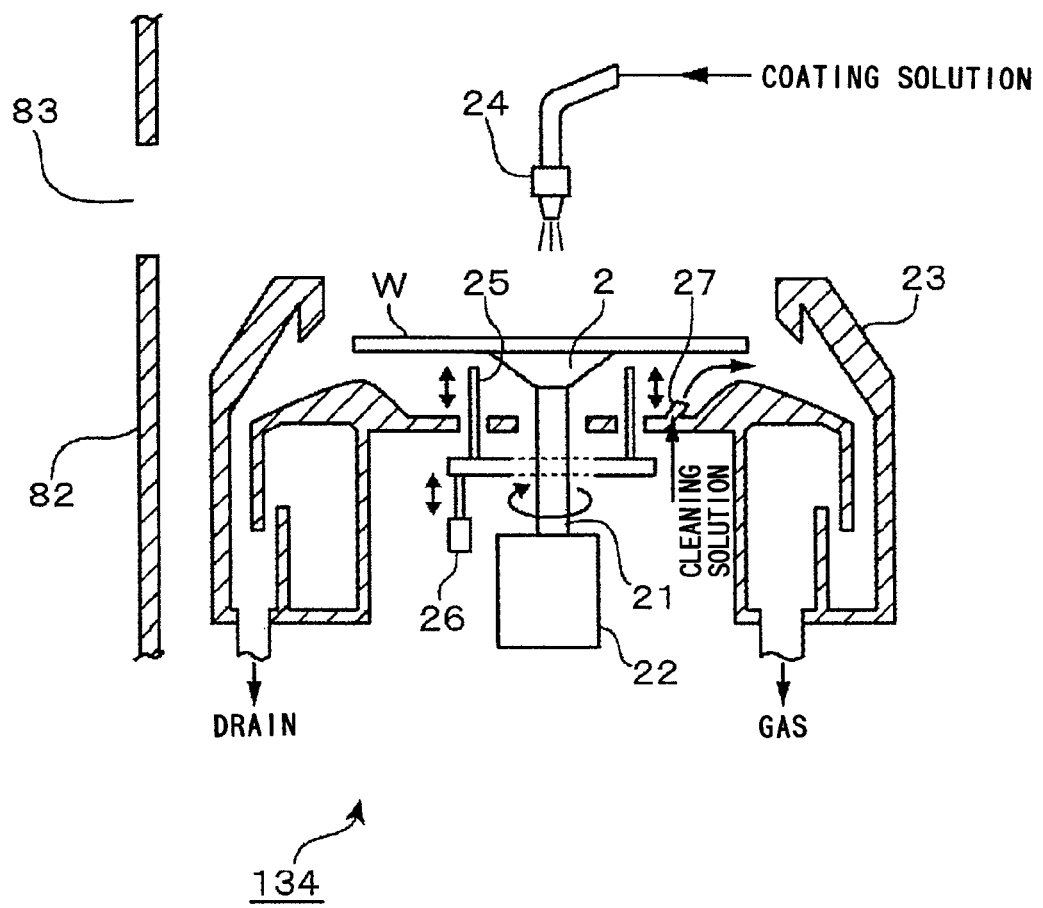
FIG. 4 is a longitudinal sectional view of a coating unit included in the coating and developing system shown in FIG. 1.

FIG. 4 is a longitudinal sectional view of the coating unit 134. The coating unit 134 has a spin chuck 2, a cup 23, a coating solution pouring nozzle 24, a cleaning solution spouting nozzle 27 for removing part of a resist solution coating a peripheral part of a wafer W.

The spin chuck, namely, the substrate holding device, 2 has a shaft 21 connected to a drive mechanism 22. A wafer W seated on the spin chuck 2 is held in a horizontal position on the spin chuck 2 by suction. The spin chuck 2 holding the wafer W can rotate. The cup 23 surrounds the wafer W held by the spin chuck 2 to arrest the resist solution scattered in all directions by the wafer W. The coating solution pouring nozzle 24 pours the resist solution from a position above the upper surface of the wafer W onto the upper surface of the wafer W. The cleaning solution spouting nozzle 27 is disposed under the wafer W to spout the cleaning solution against a peripheral part of the wafer W. Three support pins 25, namely, transfer means, are disposed under the spin chuck 2. The support pins 25 is moved vertically by a lifting mechanism 26 to transfer a wafer W between the main arm A1 (the main arm A2) and the spin chuck 2.

Operation of the coating unit 134 will be briefly described. The carrying arm 80 holding a wafer W in a horizontal position advances through the opening 83 of the wall 82 into the coating unit 134, and moves to a position above a substrate holding area of the spin chuck 2. The carrying arm 80 and the support pins 25 cooperate to transfer the wafer W from the carrying arm 80 to the upper surface of the spin chuck 2. Then, the carrying arm 80 is retracted through the opening 83 outside the coating unit 134. Subsequently, the resist solution is poured through the coating solution pouring nozzle 24 onto a substantially central part of the surface of the wafer W, and the spin chuck 2 is rotated about a vertical axis to spread the resist solution over the surface of the wafer W by spin coating. Then, the wafer W is rotated at a high rotating speed for spin-drying the resist solution. The wafer W is rotated further and the cleaning solution is spouted through the cleaning solution spouting nozzle 27 against a peripheral part of the wafer W to remove the resist solution from a peripheral part of the wafer by edge rinsing. The foregoing steps of carrying the wafer W into the coating unit 134 are reversed to carry out the wafer W having the surface coated with a resist film from the coating unit 134.

Figure 6:
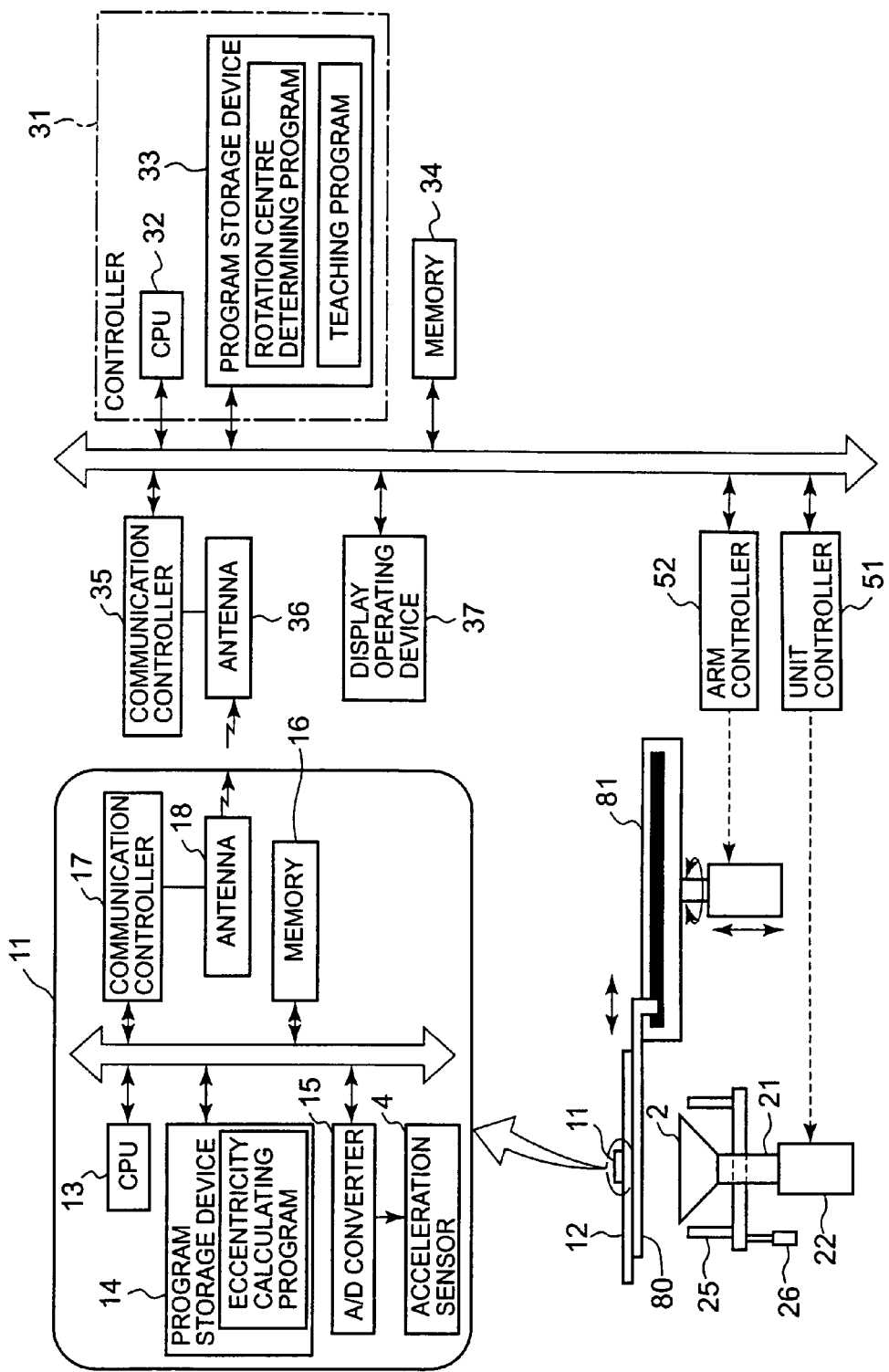
FIG. 6 is a block diagram showing the electrical configuration of devices relating to the teaching procedure.
Figure 7:
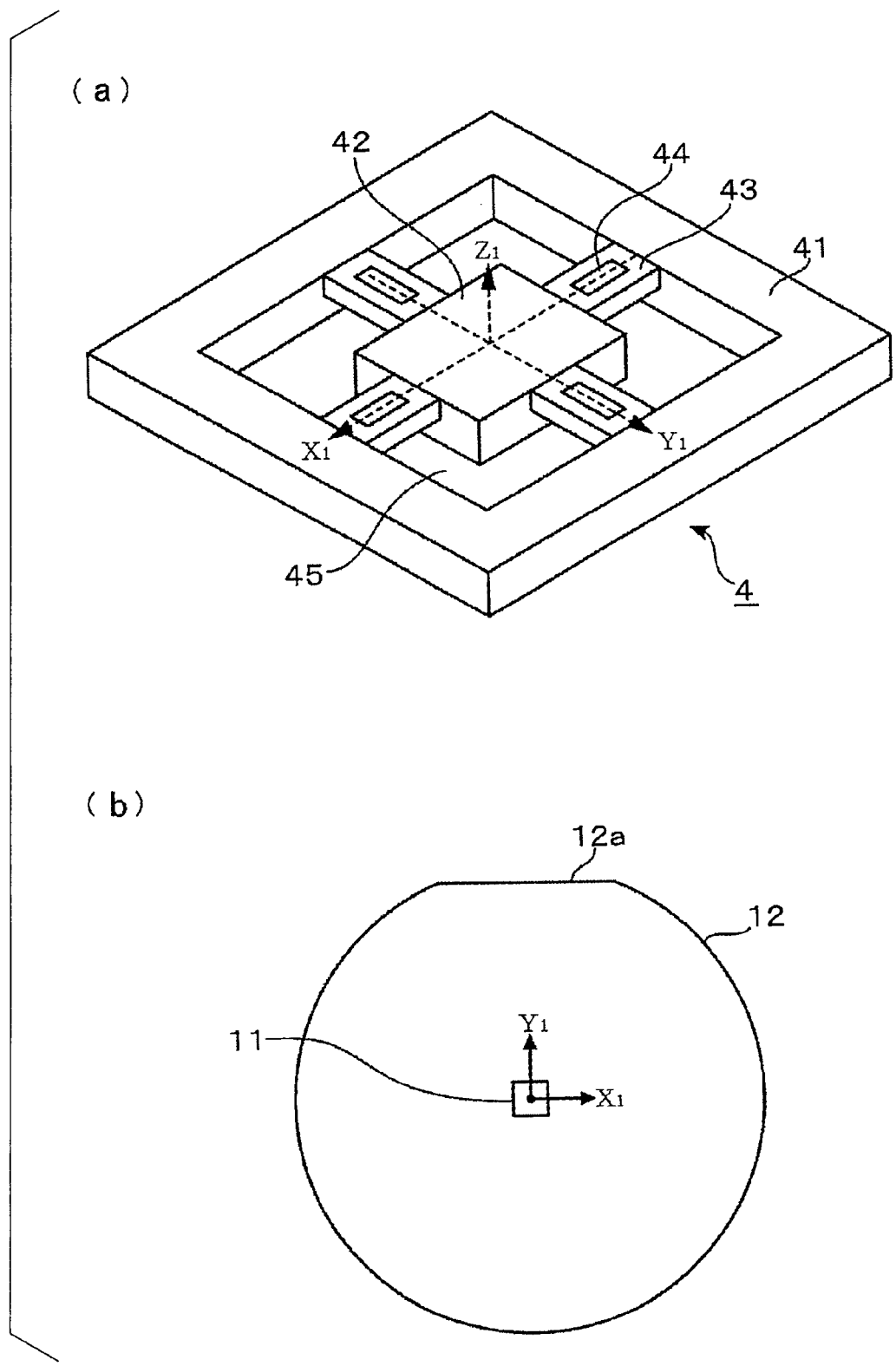
FIG. 7A is a perspective view of an acceleration sensor employed in executing the teaching procedure.
FIG. 7B is a plan view of a jig provided with the acceleration sensor.

The teaching procedure for teaching the main arm A1 (the main arm A2) will be described with reference to FIGS. 5 to 7. FIG. 5 is a schematic perspective view of a teaching system for carrying out the teaching procedure, FIG. 6 is a block diagram showing the electrical configuration of the teaching system, FIGS. 7A and 7B are views of assistance in explaining the construction of an acceleration sensor 4 and a jig 12 provided with the acceleration sensor 4 employed in executing the wafer placing position teaching procedure.

A jig 12 is used for teaching. As shown in FIG. 5, the jig 12 has a shape substantially identical with that of a wafer W, namely, a workpiece. A measuring unit 11 is attached to a central part of the jig 12 substantially at the center of a circle circumscribed about the jig 12 excluding an orientation flat. Data obtained by the measuring unit 11 can be sent by radio to a controller 31 for collectively controlling operations of the devices of the coating and developing system. In FIG. 5, indicated at 51 and 52 are unit controller and an arm controller, respectively, for controlling the spin chuck 2 of the coating unit 134, and the main arms A1 and A2, respectively, according to control commands provided by the controller 31.

Electrical configuration of the measuring unit 11 will be described with reference to FIG. 6. As shown in a balloon, the measuring unit 11 is a microcontroller including an acceleration censor 4 for measuring centrifugal acceleration imparted to a part of the jig 12 at a predetermined measuring position, a CPU 13 for collectively controlling operations of the measuring unit 11, a program storage device 14 storing programs to be executed by the CPU 13, an A/D converter for converting analog data provided by the acceleration sensor 4 into corresponding digital data, a buffer memory 16 for temporarily storing digital data provided by the A/D converter 15, antenna 18 for radio communication with the controller 31 of the coating and developing system, and a communication controller 17 for controlling radio communication using the antenna 18.

Concrete construction of the acceleration sensor 4 of the measuring unit 11, and the principle of acceleration measurement will be described with reference to FIGS. 7A and 7B. Referring to FIG. 7A, the acceleration sensor 4 includes a square frame 41 having sides of, for example, about 5 mm in length and a thickness between about 1 and about 2 mm, a weight 42 having a shape resembling a rectangular plate and suspended in a space surrounded by the square frame 41, four bridges 43 connecting the side surfaces of the weight 42 to the inside surfaces of the square frame 41, and four sensors, such as piezoelectric sensors, attached to the upper surfaces of the bridges 43, respectively. In FIG. 7A, indicated at 45 is a space surrounded by the square frame 41.

Suppose that a direction parallel to a broken line passing the pair of opposite sensors 44 with respect to the weight 42 and a direction parallel to a broken line passing the other pair of opposite sensors 44 with respect to the weight 42 are directions $X_1$ and $Y_1$, respectively. Then, as shown in FIG. 7B, the acceleration sensor 4 is held inside the measuring unit 11 such that the direction $X_1$ is parallel to the orientation flat 12a, the direction $Y_1$ is parallel to a direction perpendicular to the orientation flat 12a, and the weight 42 is substantially at the center of the jig 12. The position of the weight 42 is the measuring position.

When the spin chuck 2 holding the jig 12 rotates, centrifugal force acts on the weight 42 to move the weight 42 in the space 45, and stresses corresponding to the inclinations of the bridges 43 are induced in the bridges 43, respectively. The sensors 4 measures those stresses corresponding to magnitudes of acceleration, and sends electric signals representing those stresses to the A/D converter 15.

The program storage device 14 shown in FIG. 6 stores an eccentricity calculation program, namely, a computer program, including steps to be executed by an arithmetic unit to calculate a distance between the measuring position where the data was acquired and the rotation center of the spin chuck 2 (hereinafter, referred to "eccentricity") on the basis of the digital acceleration data provided by the A/D converter 15.

Electrical configuration of the coating and developing system will be described. As shown in FIG. 6, the controller 31 of the coating and developing system includes a central processing unit (CPU) 32 and a program storage device 33. A memory 34, an antenna 36 and a display operating device 37 are connected to the controller 31 in addition to the unit controller 51 and the arm controller 52. The memory stores the position of the rotation center of the spin chuck 2 specified by teaching. The antenna 36 is used for radio communication with the measuring unit 11 under the control of a communication controller 35. The display operating device 37 displays information to the operator and receives instructions provided by the operator by operating soft switches.

The program storage device 33 stores a rotation center determining program including steps determining operations, namely, position determining means, for determining the rotation center of the spin chuck 2 on the basis of measured data provided by the measuring unit 11, and a teaching program including steps for carrying out teaching operations. The program storage device 33 is a storage means, such as a hard disk, a compact disk, a magnetooptical disk or a memory card.

A teaching procedure to be executed by the coating and developing system will be described. This embodiment executes a teaching procedure for teaching a wafer placing position to position a wafer W on the spin chuck 2 with the center of the wafer W coincided with the rotation axis of the spin chuck 2. First, a method of determining the rotation axis of the spin chuck 2 by the measuring unit 11 will be described.

Figure 8:
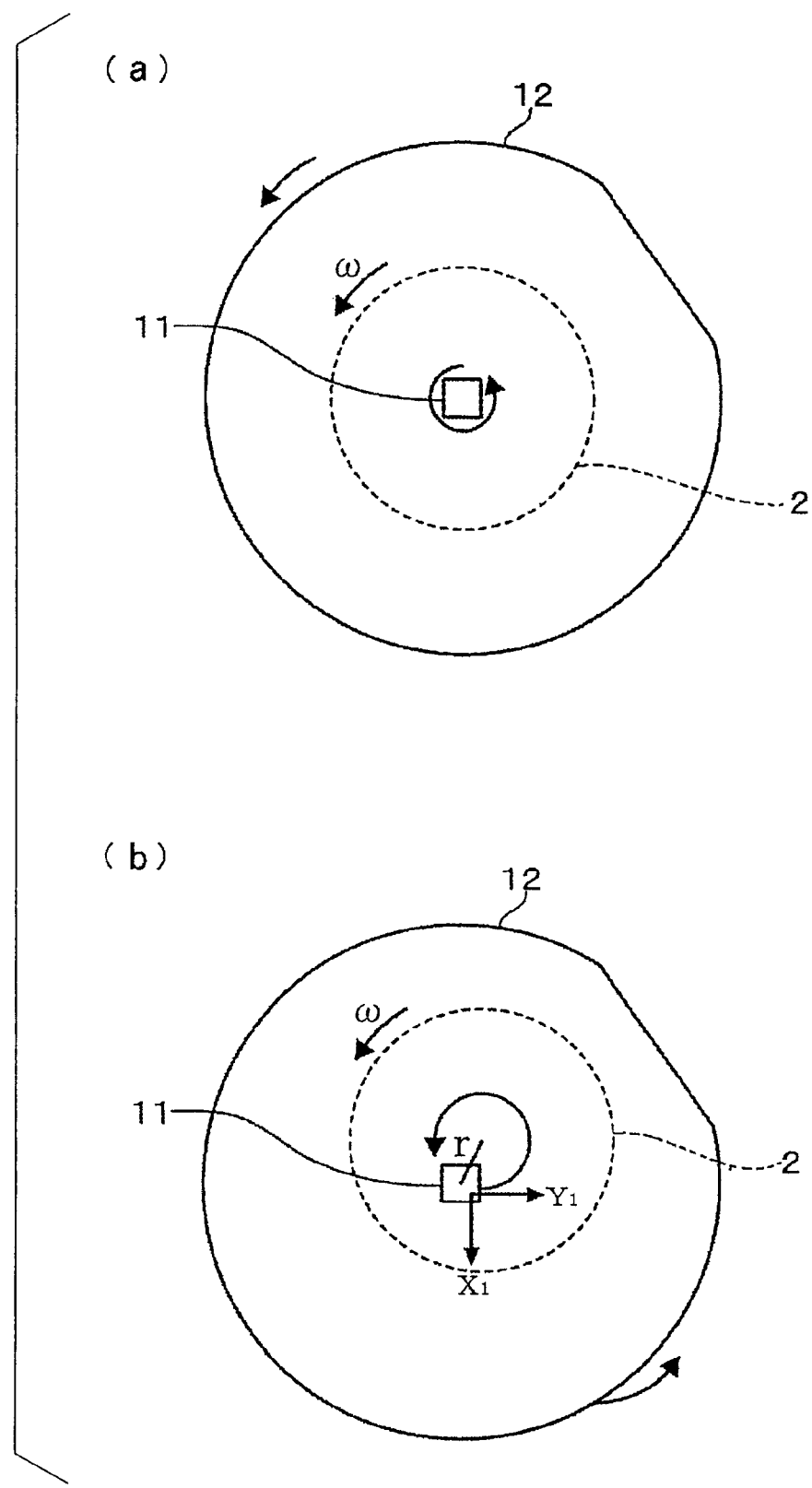
FIGS. 8A and 8B are typical plan views of assistance in explaining the movement of the acceleration sensor held on the jig placed on a spin chuck.

FIGS. 8A and 8B are conceptual views of assistance in explaining motions of the measuring unit 11 on the jig 12 placed on the spin chuck 2.

FIG. 8A shows a state where the center of the jig 12 is coincided with the rotation center of the spin chuck 2. When the spin chuck 2 is rotated in this state, centrifugal force acts scarcely on the acceleration sensor 4 of the measuring unit 11 and hence any centrifugal acceleration is not measured. When the jig 12 and the spin chuck 2 are not coaxial as shown in FIG. 8B, the measuring unit 11 revolves along a circle having a radius r equal to the eccentricity of the center of the measuring unit 11 from the rotation center of the spin chuck 2 and having its center at the rotation center of the spin chuck 2. Suppose that the spin chuck 2 rotates at a fixed angular velocity ω (rad/s). Then, centrifugal force F that acts on the weight 42 of the acceleration sensor 4 of the measuring unit 11 is expressed by: $F=m\alpha=mr\omega^2$, where m is the mass of the weight 42, α is centrifugal acceleration imparted to the acceleration sensor 4. Therefore, centrifugal acceleration $\alpha=r\omega^2$ increases in proportion to the eccentricity r.

Figure 9:
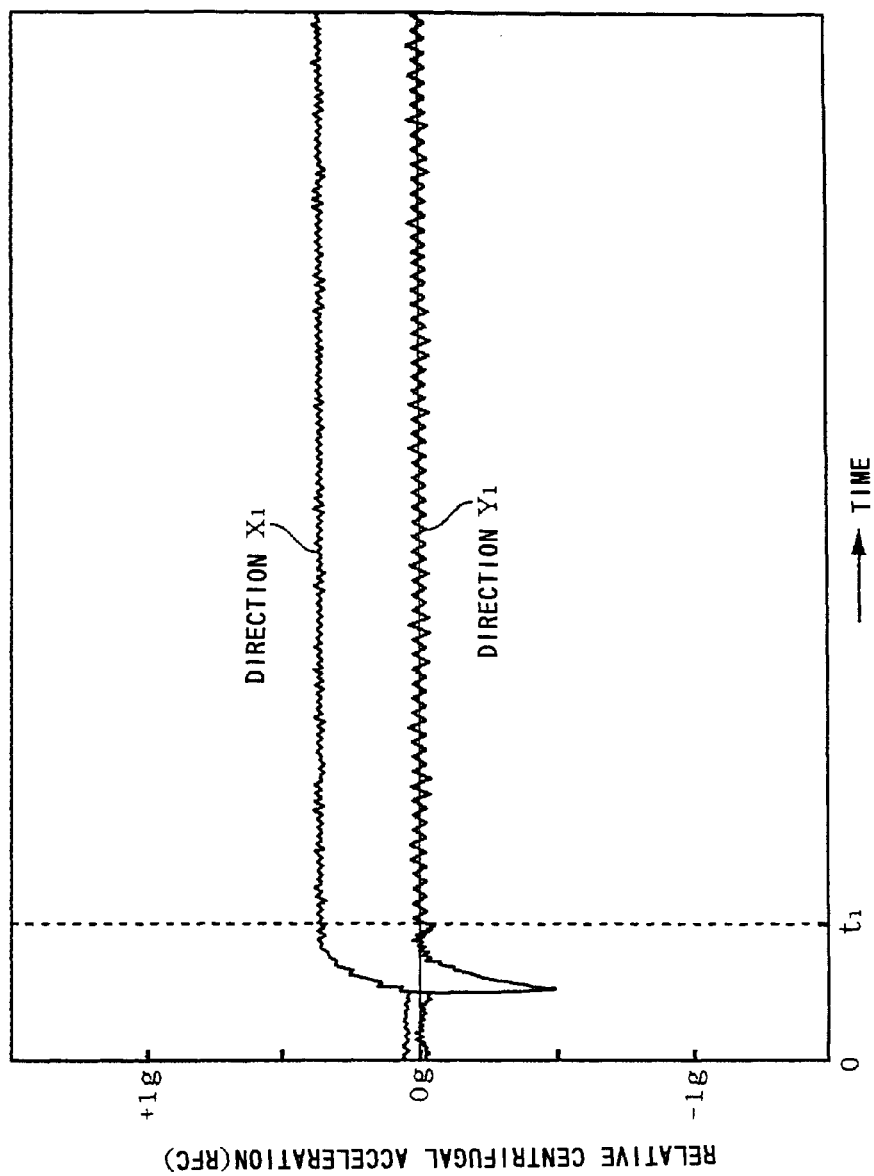
FIG. 9 is a graph showing the variation with time of acceleration measured by using the acceleration sensor held on the jig held on and rotated by a spin chuck by way of example.

When the jig 12 is placed on the spin chuck 2 such that the directions $Y_1$ and $X_1$ indicated in FIG. 7A are parallel to the rotating direction of the spin chuck 2 and parallel to a direction, perpendicular to the rotating direction, in which centrifugal force acts, respectively, as shown in FIG. 8B, the sensors 44 on the bridges 43 parallel to the direction $Y_1$ provides electric signals representing accelerations imparted to those sensors 44 when the spin chuck 2 rotates at the angular velocity ω. FIG. 9 shows the variations with time of centrifugal accelerations determined by converting the electric signals. In FIG. 9, time is measured on the horizontal axis, and relative accelerations RFC acting in the directions $X_1$ and $Y_1$ is measured on the vertical axis. Relative acceleration RFC is the ratio of measured acceleration to gravitational acceleration.

When the spin chuck 2 is rotated after placing the jig 12 on the spin chuck 2 at the position shown in FIG. 8B, the rotating speed of the spin chuck 2 reaches a fixed angular velocity at time $t_1$. The speed in the direction $Y_1$ is fixed after the $t_1$ and hence the acceleration acting in the direction $Y_1$ is measured scarcely as shown in FIG. 9. On the other hand, the magnitude of the centrifugal acceleration acting in the direction $X_1$ is proportional to the eccentricity r. Therefore, the eccentricity r can be calculated by using: $r=\{(RFC)\times g\}/\omega^2$ obtained by substituting $\alpha=r\omega^2$ into $RFC=\alpha/g$, where g is gravitational acceleration. However, it is difficult to place the jig 12 on the spin chuck 2 such that the direction $Y_1$ is parallel to the rotating direction of the spin chuck 2 unless the rotation center of the spin chuck 2 is known. That is, generally, the direction $Y_1$ is not parallel to the rotating direction of the spin chuck 2, and hence centrifugal accelerations are imparted to the acceleration sensor 4 in both the directions $X_1$ and $Y_1$. In such a case, the resultant force $F=(F_{x1}^2+F_{y1}^2)^{1/2}$ of a centrifugal force $F_{X1}$ acting in the direction $X_1$ and a centrifugal force $F_{Y1}$ acting in the direction $Y_1$ acts on the acceleration sensor 4. Therefore, the eccentricity r can be calculated by using an expression obtained by substituting $RFC=(RFC_{X1}^2+RFC_{Y1}^2)^{1/2}$, where $RFC_{X1}^2$ and $RFC_{Y1}^2$ are relative accelerations in the directions $X_1$ and $Y_1$, respectively, into the expression: $r=\{(RFC)\times g\}/\omega^2$.

The arithmetic unit included in the measuring unit 11 calculates the eccentricity of the center of the jig 12 placed on the spin chuck 2 from the rotation center of the sin chuck 2 by substituting the measured centrifugal acceleration (RFC) measured by the acceleration sensor 4 into the foregoing expressions. The angular velocity ω of the spin chuck 2 may be stored in the program storage device 14 in advance or may be given by the controller 31 through radio communication.

Figure 10:
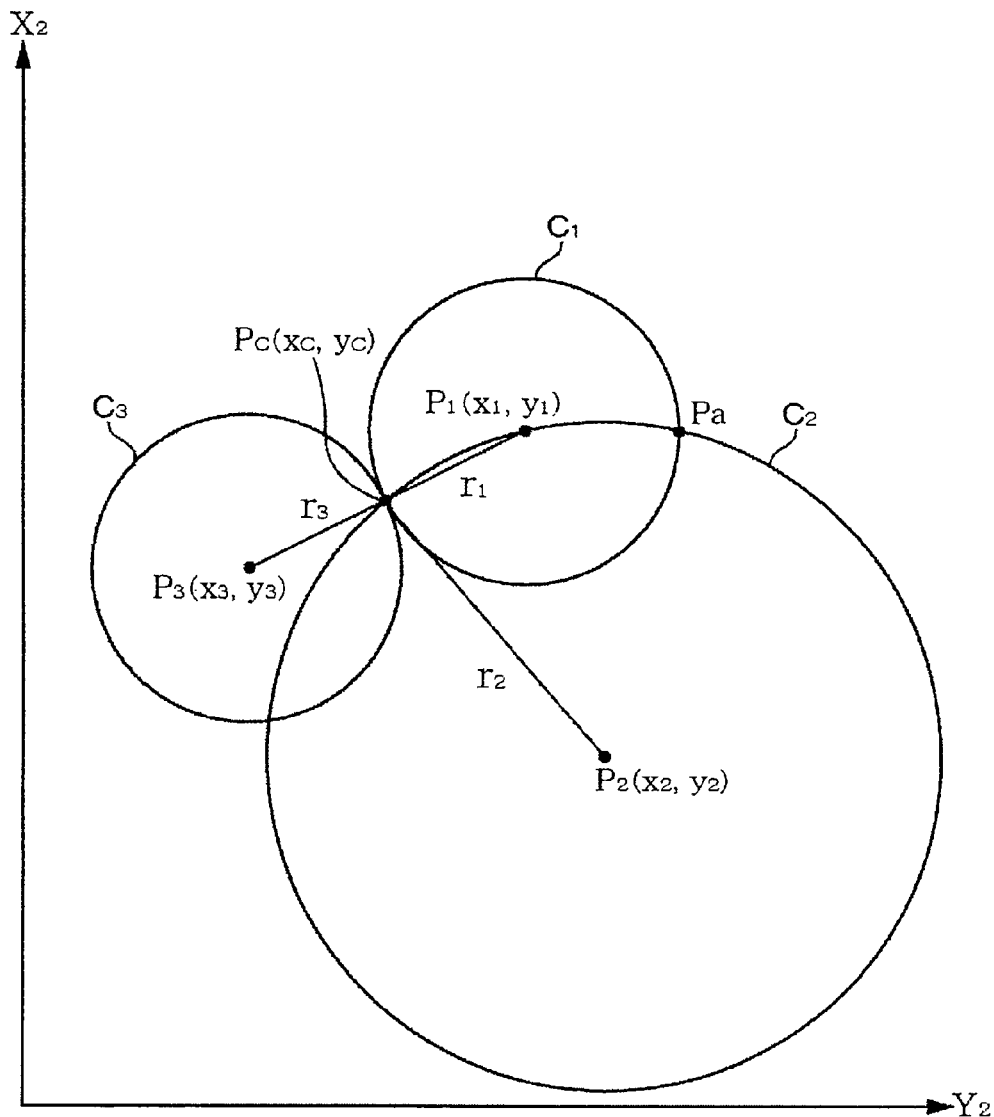
FIG. 10 is a diagram of assistance in explaining a method of determining the rotation center of the spin chuck by using the jig.

A rotation center determining procedure for determining the rotation center of the spin chuck on the basis of the eccentricity determined by the foregoing method will be described. FIG. 10 is a conceptual view of assistance in explaining a rotation center determining procedure for determining the position of the rotation center of the spin chuck 2.

An orthogonal coordinate system defined by an $X_2$ axis and a $Y_2$ axis shown in FIG. 10 contain a carrying area in which the carrying arm 80 operates. The origin of the coordinate system is, for example, at the rotation center of the carrying arms 80. The subscript "2" discriminates the coordinate axes of the coordinate system from working directions of accelerations measured by the acceleration sensor 4 described in connection with FIGS. 7 to 9.

A rotation center determining procedure for determining the rotation center of the spin chuck 2 will be described.

Step 1

The jig 12 is placed on the spin chuck 2, for example, so that the center of the jig 12 is at a position $P_1$ represented by coordinates $(x_1, y_1)$. Then, the spin chuck 2 is rotated and the measuring unit 11 is actuated. Thus an eccentricity $r_1$ of the measuring position $P_1$ of the jig 12 placed on the spin chuck 2 from the rotation center is obtained. It is known that the rotation center of the spin chuck 2 is on a circle $C_1$ of a radius $r_1$ having its center at the position $P_1$.

Step 2

The position of the jib 12 is changed to place the jig 12 on the spin chuck 2, for example, so that the center of the jig 12 is at a position $P_2$ represented by coordinates $(x_2, y_2)$. The same operations are carried out. Thus an eccentricity $r_2$ of the position $P_2$ from the rotation center is obtained. It is known that the rotation center of the spin chuck 2 is on a circle $C_2$ of a radius $r_2$ having its center at the position $P_2$. It is expected that the rotation center of the spin chuck 2 is at either of the two intersection points $P_a$ and $P_c$ of the circles $C_1$ and $C_2$.

Step 3

The position of the jib 12 is changed again to place the jig 12 on the spin chuck 2, for example, so that the center of the jig 12 is at a position $P_3$ represented by coordinates $(X_3, y_3)$. The same operations are carried out. Thus a circle $C_3$ of a radius $r_3$ equal to an eccentricity $r_3$ of the position $P_3$ from the rotation center is determined. It is decided that the rotation center of the spin chuck 2 is at the intersection point $P_c$ of the three circles $C_1$, $C_2$ and $C_3$. The coordinates $(x_c, y_c)$ of the intersection point $P_c$ can be obtained by solving simultaneous equations expressing the three circles $C_1$, $C_2$ and $C_3$. A position of the jig 12 on the spin chuck 2, where the center of the jig 12 corresponding to that of a wafer W coincides with the rotation center of the spin chuck 2 is specified as a wafer placing position at which a wafer W is to be placed on the spin chuck 2 by converting the coordinates $(x_c, y_c)$ of the intersection point $P_c$ into those in a polar coordinate system.

Data on the positions at which the jig 12 is placed on the spin chuck, such as the positions $P_1$ to $P_3$, may be stored beforehand and operations of the carrying arm 80 may be automatically controlled by the controller 31 to place the jig 12 on the spin chuck 2. Steps 1 to 3 as mentioned above or those positions may be specified by the operator in Steps 1 to 3.

Figure 11:
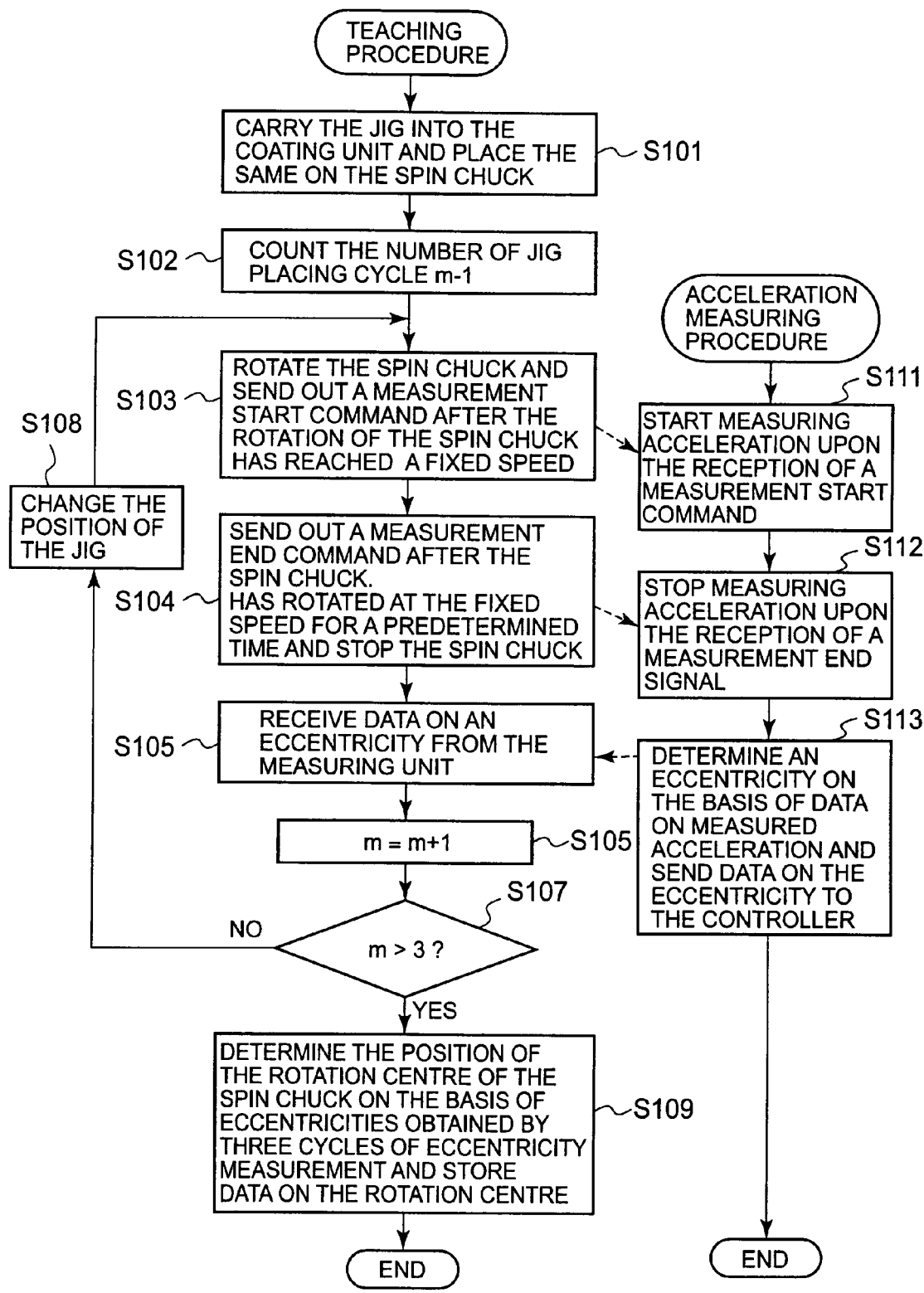
FIG. 11 is a flow chart of the teaching procedure.

A teaching procedure to be executed by the embodiment will be described on the basis of the foregoing procedure with reference to a flow chart shown in FIG. 11. After the teaching procedure has been started (START), the jig 12 is carried into the coating unit 134 and is placed at a predetermined position on the spin chuck 2 in step S101. One jig placing cycle number m=1 is counted in step S102. The rotation of the spin chuck 2 is started and a measurement start command is give to the measuring unit 11 after the angular velocity of the spin chuck 2 has been stabilized at a fixed angular velocity in step S103. A measurement end command is give to the measuring unit 11 after a predetermined time has passed since the stabilization of the angular velocity of the spin chuck 2 and the spin chuck 2 is stopped in step S104.

Upon the reception of the measurement start command from the controller 31, the measuring unit 11 starts an acceleration measuring procedure (START). The acceleration measuring procedure measures accelerations imparted to the acceleration sensor 4 in step S111. Upon the reception of a measurement end command from the controller 31, the measuring unit 11 ends the acceleration measuring procedure in step S112. An eccentricity from the rotation center is calculated by using data on acceleration obtained by the acceleration measuring procedure and data on the eccentricity is sent to the controller 31 in step S113, and then the acceleration measuring procedure is ended (END).

The controller 31 receives the data on the eccentricity from the measuring unit in step S105, and increments the jig placing cycle number m by one (m←m+1) in step S106. A query is made in step S107 to see whether or not data on eccentricity has been received three times. If the response to the query made in step S107 is negative, i.e., data on eccentricity has not been received three times, the position of the jig 12 on the spin chuck 2 is changed in step S108, and then steps S103 to S107 and steps S111 to S113 are executed again to receive data on eccentricity of the jig 12 at the new position.

If the response to the query made in step S107 is affirmative, i.e., data on eccentricity has been received three times, the rotation center of the spin chuck 2 is determined by the method previously described with reference to FIG. 10. The rotation center of the spin chuck 2 thus determined is stored as a desired position with which the center of the wafer W placed on the spin chuck is to be coincided in step S109, and then the teaching procedure is ended (END). The controller 31 controls the operation of the carrying arm 80 so that the carrying arm 80 places a wafer W on the spin chuck 2 with the center of the wafer W coincided with the rotation center of the spin chuck 2. The spin chuck 2 may be movable parallel to an R-θ plane shown in FIG. 3 and the spin chuck 2 may be moved relative to a wafer W placed thereon so that the rotation center of the spin chuck 2 coincides with the center of the wafer W.

Since the eccentricity of the measuring position from the rotation center of the spin chuck 2 by rotating the spin chuck 2 holding the jig 12, and the rotation center of the spin chuck is determined on the basis of the eccentricity, an accurate, inexpensive teaching operation can be achieved, while a teaching operation using a CCD camera is expensive.

Since the intersection point of the three circles having the radii respectively corresponding to the eccentricities of the measuring positions, namely, the positions of the center of the jig 12, from the rotation center when the jig is placed at three positions on the spin chuck 2 is determined to be the rotation center of the spin chuck 2, image processing is unnecessary, load on the computer is light, and hence the rotation center of the spin chuck 2 can be determined in a comparatively short time by a small, comparatively inexpensive computer.

A possible method of determining the rotation center of the spin chuck 2 is not limited to the foregoing method. For example, the rotation center of the spin chuck 2 may be determined by a method including the steps of determining the two intersection points $P_a$ and $P_c$ of the two circles $C_1$ and $C_2$ by the method described in connection with FIG. 10, changing the position of the jig 12 on the spin chuck 2 so that the measuring position, namely, the center of the jig 12, coincides with one of the two intersection points $P_a$ and $P_c$, rotating the spin chuck 2, and determining whether or not measured centrifugal acceleration is zero to determine whether or not the center of the jig 12 coincides with the rotation center of the spin chuck 2 when the jig 12 is placed on the spin chuck 2 for the third time. If the measured centrifugal acceleration is zero, the position of the center of jig is the rotation center. If the centrifugal acceleration is not zero, it is known that the other intersection point is the rotation center. When the rotation center is determined by this method, it may be decided whether or not the measured centrifugal acceleration is not higher than a predetermined limit instead of deciding whether or not the measured centrifugal acceleration is zero. This decision method is effective when some error is permitted in the rotation center.

Attachment of the small piezoelectric sensor 4 as a measuring means to the jig 12 eliminates a space for installing a special device for determining the rotation center of the spin chuck 2, such as a CCD camera, from the substrate processing system and contributes to reducing the size of the substrate processing system. The acceleration sensor to be attached to the jig 12 is not limited to the piezoelectric acceleration sensor; the acceleration sensor may be, for example, a capacitance type acceleration sensor or the like.

Since the measuring unit 11 and the controller 31 exchange data by radio communication, wiring for connecting the measuring unit 11 and the controller 31 is unnecessary and the controller 31 can obtain data from the measuring unit 11 on the rotating spin chuck 2 in real time. the data obtained by the measuring unit 11 including an eccentricity and a centrifugal acceleration may be stored in the buffer memory to make the controller 31 obtain the data later from the buffer memory 16 by connecting the buffer memory 16 to the controller instead of sending the data to the controller 31 by radio. It goes without saying that the measuring unit 11 and the controller 31 may exchange data by wire communication.

When the measuring unit 11 has the function of an arithmetic means to determine an eccentricity, an operation for calculating the eccentricity and that for determining the rotation center of the spin chuck 2 can be separately carried out and load on the controller 31 is reduced. Naturally, the controller 31 may have the arithmetic function to calculate the eccentricity instead of the measuring unit 11.

Since the jig 12 is identical in shape with a wafer W, any special device for placing the jig 12 on the spin chuck 2 is not necessary, and the carrying arm 80 can be used for teaching.

A coating and developing system in a second embodiment according to the present invention will be described. The acceleration sensor 4 shown in FIG. 7 can measure acceleration acting in a $Z_1$ direction indicated in FIG. 7. The second embodiment executes a teaching procedure for teaching a wafer placing position with respect to a direction Z indicated in FIG. 3.

Figure 12A:
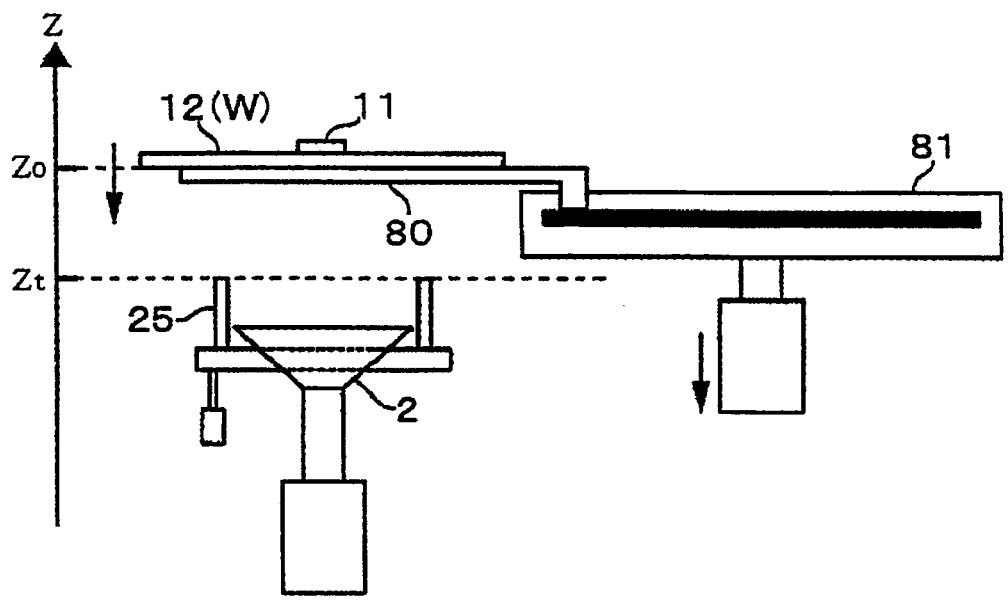
FIGS. 12A and 12B are side elevations of assistance in explaining a teaching procedure in a second embodiment according to the present invention.
Figure 12B:
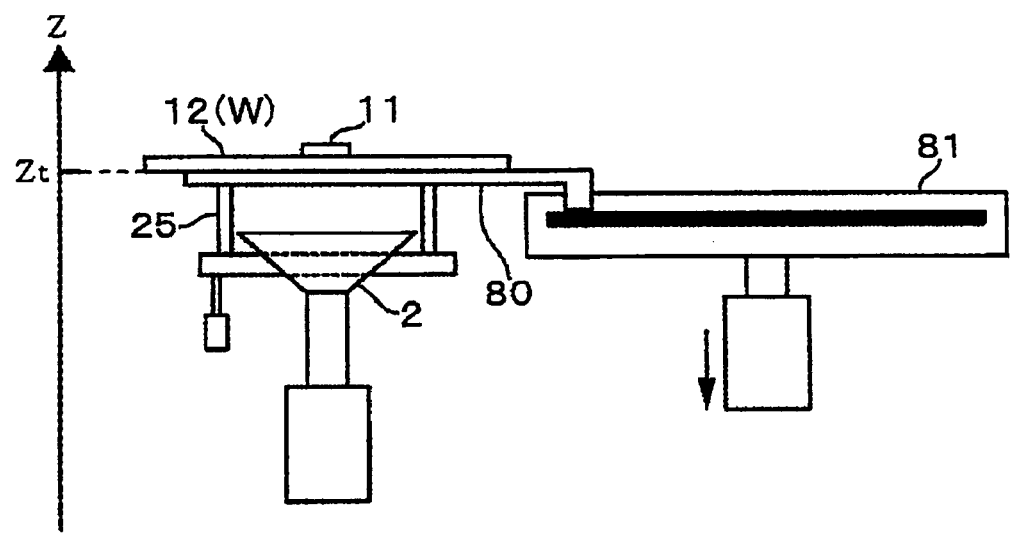

The coating and developing system in the second embodiment is identical in construction with that illustrated in FIGS. 1 to 7 and hence the description of the construction of the coating and developing system in the second embodiment will be omitted. FIGS. 12A and 12B are side elevations of assistance in explaining a teaching procedure relevant to the second embodiment. FIG. 12A shows a state where the carrying arm 80 holding a wafer W (the jig 12) and entered the coating unit 134 has stopped at a position above the spin chuck 2. In this state, the lower surface of the wafer W (the jig 12) is at a vertical position $Z_0$ with respect to the direction Z, and the tips of the support pins 25 raised to their top positions are at a vertical position $Z_t$ with respect to the direction Z. The carrying arm 80 is lowered to transfer the wafer W (the jig 12) from the carrying arm 80 to the support pins 25. Upon the arrival of the lower surface of the wafer W (the jig 12) at the vertical position $Z_t$, the wafer W (the jig 12) is transferred from the carrying arm 80 to the support pins 25. If the carrying arm 80 is retracted before the lower surface of the wafer W (the jig 12) reaches the vertical position $Z_t$, the wafer W (the jig 12) held by the carrying arm 80 is carried out of the coating unit 134 and the wafer W (the jig 12) cannot be placed on the spin chuck 2.

Operations illustrated in FIGS. 12A and 12B are executed by using the carrying arm 80 holding the jig 12 instead of the wafer W, and a position where a wafer W is to be transferred to the support pins 25 is determined on the basis of acceleration acting in the direction $Z_1$ measured during the operations.

Figure 13:
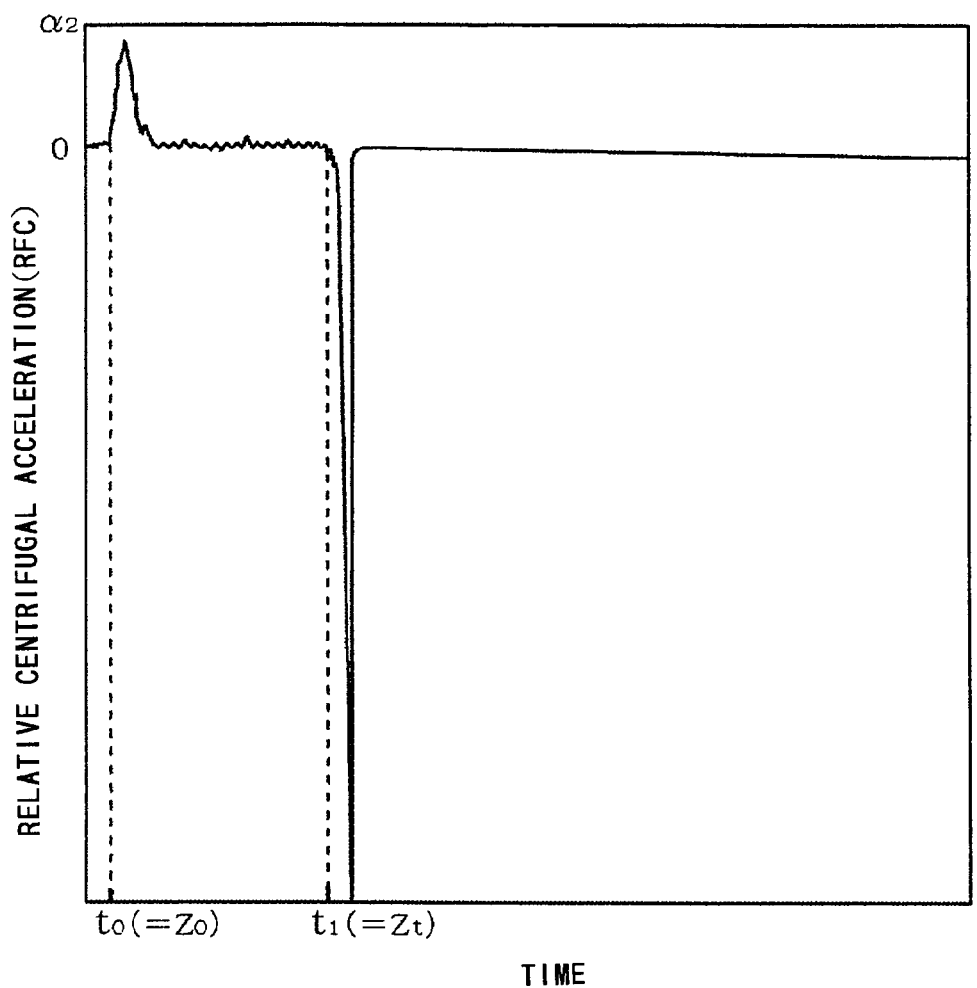
FIG. 13 is a graph showing the variation with time of acceleration measured by the second embodiment by way of example.

FIG. 13 is a graph showing the variation with time of the acceleration acting in the direction $Z_1$ during the operations described in connection with FIGS. 12A and 12B. In FIG. 13, time is measured on the horizontal axis and relative acceleration RFC is measured on the vertical axis. FIG. 13 shows the variation with time of measured acceleration when the carrying arm 80 holding the jig 12 with the lower surface of the jig 12 positioned at the vertical position $Z_0$ starts lowering at a fixed speed at time to, and the lower surface of the jig 12 reaches the position $Z_t$ at time $t_1$.

As obvious from FIG. 13, peaks appear in the acceleration curve during a period between the start of lowering of the jig 12 and increase of lowering speed of the jig 12 to a fixed speed and at time immediately after time $t_1$ when the jig 12 is transferred to the support pins 25. Since the moving speed of the jig 12 drops instantly to zero at time $t_1$, a sharp peak acceleration acting in a direction opposite a direction in which the jig 12 is moved appears. The controller 31 stores positions of the carrying arm 80 at times during teaching, obtains acceleration data from the measuring unit 11, and decides that a wafer W is transferred from the carrying arm 80 to the support pin 25 at time the acceleration acting in the direction opposite the moving direction of the wafer W is measured. The second embodiment differs from the first embodiment in that the measuring unit 11 sends the measured acceleration data to the controller 31 instead of sending a calculated eccentricity to the controller 31.

Figure 14:
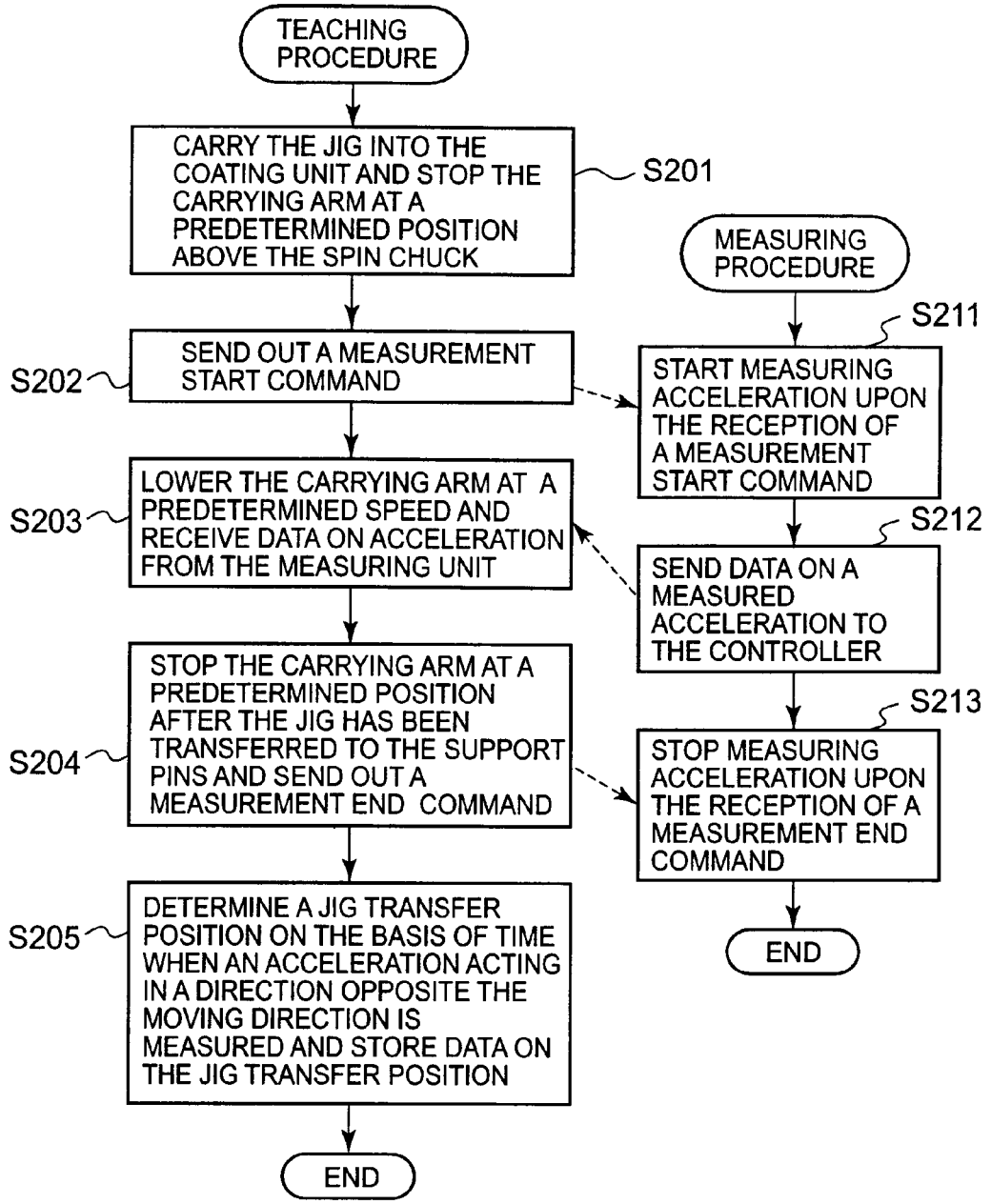
FIG. 14 is a flow chart of the teaching procedure in the second embodiment.

A teaching procedure relevant to the second embodiment will be described on the basis of this method. The teaching procedure to be executed by the second embodiment will be described with reference to a flow chart shown in FIG. 14. After the teaching procedure has been started (START), the jig 12 is carried into the coating unit 134 and the carrying arm 80 is stopped to position the jig at the predetermined position $Z_0$ (FIG. 12) above the spin chuck 2 in step S201. A measurement start command is given to the measuring unit 11 in step S202. Then, the controller 31 receives acceleration data sent out from the measuring unit 11 while the carrying arm 80 is moving down at a fixed speed in step S203.

Upon the reception of a measurement start command from the controller 31, the measuring unit 11 starts measuring acceleration in step S211, and sends the measured acceleration to the controller 31 in real time in step S212. The controller 31 stops the carrying arm 80 at a predetermined position, such as the known predetermined position of the carrying arm 80 immediately after the jig 12 has been transferred to the support pins 25, and gives a measurement end command to the measuring unit 11 in step S204. Upon the reception of the measurement end command, the measuring unit 11 stops measuring acceleration in step S213 and the operation is ended (END).

The controller 31 determines a transfer position where the jig 12 is transferred to the support pin 35 on the basis of time when the acceleration acting in a direction opposite the moving direction of the carrying arm 80 is measured in step S205 and stores the transfer position in step S205, and the teaching procedure is ended (END)

Figure 3:
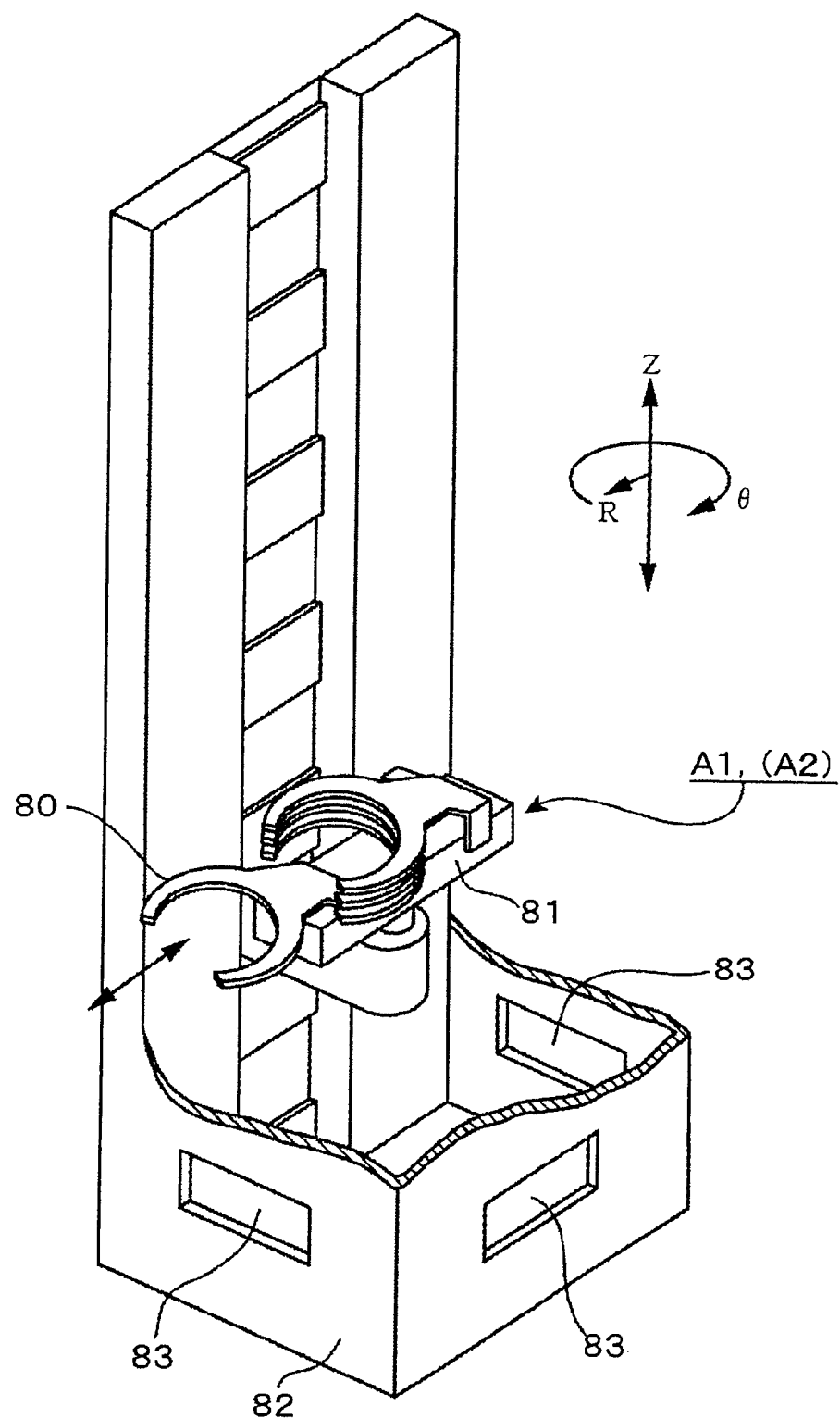
FIG. 3 is a perspective view of a substrate carrying device included in the coating and developing system shown in FIG. 1.

The second embodiment can carry out the transfer position teaching procedure for teaching the transfer position with respect to the direction Z indicated in FIG. 3 at which a wafer W is transferred from the carrying arm 80 to the support pins 25 by using the jig 12 for teaching a substrate placing position in a plane parallel to the R-θ plane (FIG. 3) on the spin chuck 2. Therefore, any equipment for teaching the position with respect to the direction Z is not necessary and hence the cost-performance ratio of the coating and developing system is high. The transfer position where the jig 12 is transferred to the support pins 25 may be determined on the basis of time when downward acceleration is measured at the transfer of the jig 12 from the support pin 25 to the carrying arm 80 being moved upward from a position below the jig 12 supported on the support pins 25. Although the coating unit 134 of the foregoing embodiment transfers a wafer W through the support pins 25 to the spin chuck 2, a wafer W may be directly transferred to the spin chuck 2 without using the support pins 25.

What is claimed is:

1. A substrate processing system having a processing unit for processing a substrate held substantially horizontally by a substrate holding device rotatable about a vertical axis, and capable of acquiring data on a wafer placing position on the substrate holding device, at which a substrate carrying unit places the substrate, beforehand, said substrate processing system comprising:
a jig to be transferred to the substrate holding device by the substrate carrying unit;
a measuring means for measuring centrifugal acceleration imparted to a measuring position on the jig when the substrate holding device holding the jig is rotated at a fixed angular velocity;
an arithmetic means for calculating an eccentricity of the measuring position from a rotation center of the substrate holding device on a basis of the centrifugal acceleration measured by the measuring means;
a position determining means for determining position of the rotation center of the substrate holding means on a basis of eccentricities of two substrate placing positions determined by changing the position of the jig on the substrate holding device, and a centrifugal acceleration imparted to or an eccentricity of a substrate placing position other than the two substrate placing positions; and
a storage means for storing data on a position of a substrate where a center of the substrate coincides with the rotation center of the substrate holding device as data on a substrate placing position.

2. The substrate processing system according to claim 1, wherein the position determining means draws three circles having radii corresponding to eccentricities of the measuring position of the jig placed at three different placing positions on the substrate holding means from the rotation center of the substrate holding means, and centers at the three different substrate placing positions, respectively, and determines an intersection point of the three circles as the rotation center of the substrate holding means.

3. The substrate processing system according to claim 1, wherein the position determining means places the jig at two different placing positions on the substrate holding means, draws two circles having radii corresponding to eccentricities of the measuring position of the jig placed at the two different placing positions from the rotation center of the substrate holding means, and centers at the two different substrate placing positions, respectively, places the jig again such that the measuring position thereof coincides with one of two intersections of the two circles, determines the measuring position of the jig to be the rotation center of the substrate holding device if centrifugal acceleration imparted to the measuring position is zero or lower than a predetermined value or determines the other intersection point of the two circles to be the rotation center if the measured acceleration is not zero or above the predetermined value.

4. The substrate processing system according to claim 1, further comprising an instructing means for giving an instruction indicating a jig placing position to the substrate carrying unit.

5. The substrate processing system according to claim 1, wherein the arithmetic means is connected to the measuring means on the jig.

6. The substrate processing system according to claim 1, wherein the measuring means or the arithmetic means sends data on the centrifugal acceleration or the eccentricities to the position determining means by radio.

7. The substrate processing system according to claim 1, wherein the jig has a shape identical with that of a substrate to be processed by the substrate processing system.

8. The substrate processing system according to claim 7, wherein the measuring means is attached to the jig such that the measuring position coincides with the center of the jig.

9. The substrate processing system according to claim 1, wherein the measuring means is a piezoelectric acceleration sensor.

10. The substrate processing system according to claim 1, further comprising a substrate transfer unit, the substrate transfer unit being vertically movable support members capable of receiving a substrate at a position above the substrate holding device and of lowering to place the substrate on the substrate holding device or the substrate holding device,
wherein the substrate carrying unit is capable of transferring a substrate to and receiving a substrate from the substrate transfer unit by moving up or down at a fixed speed and intersecting the substrate transfer unit without interfering with the substrate transfer unit,
the measuring means being capable of measuring acceleration imparted to the jig when the jig moves vertically, and
a second position determining means for determining a substrate placing position with respect to a vertical direction between the substrate carrying unit and the substrate transfer unit on a basis of a position of the substrate carrying unit at a time point when acceleration acting in a direction opposite a moving direction of the substrate carrying unit is measured.

11. A substrate processing system comprising:
a processing unit that processes a substrate held substantially horizontally by a substrate holding device rotatable about a vertical axis, and that acquires data on a substrate placing position on the substrate holding device, at which a substrate carrying unit places the substrate, beforehand;
a jig transferable to the substrate holding device by the substrate carrying unit;
a measuring unit that measures centrifugal acceleration imparted to a measuring position on the jig when the substrate holding device holding the jig is rotated at a fixed angular velocity;

an arithmetic unit that calculates an eccentricity of the measuring position from a rotation center of the substrate holding device on a basis of the centrifugal acceleration measured by the measuring unit;

a position determining unit that determines position of the rotation center of the substrate holding device on a basis of eccentricities of two substrate placing positions determined by changing the position of the jig on the substrate holding device, and a centrifugal acceleration imparted to or an eccentricity of a substrate placing position other than the two substrate placing positions; and a storage unit that stores data on a position of a substrate where a center of the substrate coincides with the rotation center of the substrate holding device as data on a substrate placing position.

12. The substrate processing system according to claim 11, wherein the position determining unit draws three circles having radii corresponding to eccentricities of the measuring position of the jig placed at three different placing positions on the substrate holding device from the rotation center of the substrate holding device, and centers at the three different substrate placing positions, respectively, and determines an intersection point of the three circles as the rotation center of the substrate holding device.

13. The substrate processing system according to claim 11, wherein the position determining unit places the jig at two different placing positions on the substrate holding device, draws two circles having radii corresponding to eccentricities of the measuring position of the jig placed at the two different placing positions from the rotation center of the substrate holding device, and centers at the two different substrate placing positions, respectively, places the jig again such that the measuring position thereof coincides with one of two intersections of the two circles, determines the measuring position of the jig to be the rotation center of the substrate holding device if centrifugal acceleration imparted to the measuring position is zero or lower than a predetermined value or determines the other intersection point of the two circles to be the rotation center if the measured acceleration is not zero or above the predetermined value.

14. The substrate processing system according to claim 11, further comprising an instructing unit that gives an instruction indicating a jig placing position to the substrate carrying unit.

15. The substrate processing system according to claim 11, wherein the arithmetic unit is connected to the measuring unit on the jig.

16. The substrate processing system according to claim 11, wherein the measuring unit or the arithmetic unit sends data on the centrifugal acceleration or the eccentricities to the position determining unit by radio.

17. The substrate processing system according to claim 11, wherein the jig has a shape identical with that of a substrate to be processed by the substrate processing system.

18. The substrate processing system according to claim 17, wherein the measuring unit is attached to the jig such that the measuring position coincides with the center of the jig.

19. The substrate processing system according to claim 11, wherein the measuring unit is a piezoelectric acceleration sensor.

20. The substrate processing system according to claim 11, further comprising a substrate transfer unit, the substrate transfer unit being vertically movable support members capable of receiving a substrate at a position above the substrate holding device and of lowering to place the substrate on the substrate holding device or the substrate holding device, wherein the substrate carrying unit is capable of transferring a substrate to and receiving a substrate from the substrate transfer unit by moving up or down at a fixed speed and intersecting the substrate transfer unit without interfering with the substrate transfer unit, the measuring unit is capable of measuring acceleration imparted to the jig when the jig moves vertically, and a second position determining unit determines a substrate placing position with respect to a vertical direction between the substrate carrying unit and the substrate transfer unit on a basis of a position of the substrate carrying unit at a time point when acceleration acting in a direction opposite a moving direction of the substrate carrying unit is measured.

* * * * *